(12) United States Patent
Peng et al.

(10) Patent No.: US 12,482,724 B2
(45) Date of Patent: Nov. 25, 2025

(54) PACKAGE STRUCTURE AND PACKAGE SYSTEM

(71) Applicant: Huawei Technologies Co., Ltd., Guangdong (CN)

(72) Inventors: Hao Peng, Shanghai (CN); Xiaojing Liao, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 456 days.

(21) Appl. No.: 17/863,047

(22) Filed: Jul. 12, 2022

(65) Prior Publication Data
US 2023/0018603 A1  Jan. 19, 2023

(30) Foreign Application Priority Data
Jul. 13, 2021  (CN) .......................... 202110788134.4

(51) Int. Cl.
*H01L 23/482* (2006.01)
*H01L 23/00* (2006.01)
(Continued)

(52) U.S. Cl.
CPC ........ *H01L 23/482* (2013.01); *H01L 23/5386* (2013.01); *H01L 24/20* (2013.01);
(Continued)

(58) Field of Classification Search
CPC ... H01L 23/482; H01L 23/5386; H01L 24/20; H01L 24/24; H01L 23/3121; H01L 23/3735; H01L 2224/214; H01L 2224/24137; H01L 2224/24175; H01L 2224/24227; H01L 2224/24247; H01L 2224/244; H01L 2224/32225; H01L 2224/32245; H01L 2924/15153; H01L 2924/1517

See application file for complete search history.

(56) References Cited

U.S. PATENT DOCUMENTS

2012/0320545 A1* 12/2012 Lo Presti .............. H05K 3/325
                                                           361/752
2013/0043574 A1   2/2013 Williams et al.
(Continued)

FOREIGN PATENT DOCUMENTS

JP      H06224334      *  8/1994
JP      H06224334  A   *  8/1994

*Primary Examiner* — Jacob Y Choi
*Assistant Examiner* — Neil R Prasad
(74) *Attorney, Agent, or Firm* — WOMBLE BOND DICKINSON (US) LLP

(57) ABSTRACT

This application discloses a package structure and a package system. The package structure may be used for packaging various types of chips, and is coupled to a PCB, so as to form the package system. The package structure includes a package base layer, a chip, a package body, and a connecting assembly. The package base layer has a first surface and a second surface that are opposite to each other. The chip is coupled to the first surface, and there is a chip pad on a surface that is of the chip and that is away from the package base layer. The package body covers the package base layer and the chip to protect the structure, and the chip pad is wired to a surface of the package body through the connecting assembly.

18 Claims, 5 Drawing Sheets

(51) Int. Cl.
*H01L 23/538* (2006.01)
*H01L 23/31* (2006.01)
*H01L 23/373* (2006.01)

(52) U.S. Cl.
CPC .......... *H01L 24/24* (2013.01); *H01L 23/3121* (2013.01); *H01L 23/3735* (2013.01); *H01L 2224/214* (2013.01); *H01L 2224/24137* (2013.01); *H01L 2224/24175* (2013.01); *H01L 2224/24227* (2013.01); *H01L 2224/24247* (2013.01); *H01L 2224/244* (2013.01); *H01L 2224/32225* (2013.01); *H01L 2224/32245* (2013.01); *H01L 2924/15153* (2013.01); *H01L 2924/1517* (2013.01)

(56) References Cited

U.S. PATENT DOCUMENTS

| | | | |
|---|---|---|---|
| 2019/0273044 A1* | 9/2019 | Fu | H01L 23/5386 |
| 2020/0219846 A1* | 7/2020 | Ji | H01L 23/3121 |
| 2020/0312741 A1* | 10/2020 | Wan | H01L 23/38 |
| 2020/0321261 A1* | 10/2020 | Fujino | H01L 23/3128 |
| 2021/0118765 A1* | 4/2021 | Kang | H01L 21/4857 |

* cited by examiner

PACKAGE STRUCTURE AND PACKAGE SYSTEM

CROSS-REFERENCE TO RELATED APPLICATION

This application claims priority to Chinese Patent Application No. 202110788134.4, filed on Jul. 13, 2021, which is hereby incorporated by reference in its entirety.

TECHNICAL FIELD

This application relates to the field of packaging technologies, and in particular, to a package structure and a package system.

BACKGROUND

To improve performance of an electronic product in the industry, more components are gradually integrated on the basis of a discrete power device, and are packaged into a package structure, so as to achieve an objective of higher integration, a smaller total area, and simplified processing.

A large package structure is generally housing package, and a small power and IPM (intelligent power module, intelligent package structure) is generally molding package. Pins are used in both the two package forms. A pin in the housing package extends from a middle position of the structure, while a pin in the molding package is formed by punching and bending a pin from a wire-bond frame on a side of the molding package, or is inserted into a groove in a middle position of a molding body.

Pins need to be used in both package manners of the foregoing two package structures. As a result, a product size is large. In addition, an excessively long wire-bond path in a manufacturing process may cause a parasitic effect.

SUMMARY

This application provides a package structure and a package system, so as to reduce a size of the structure and simplify a wire-bond path.

According to a first aspect, this application provides a package structure. The package structure may be used for packaging various types of chips, and is coupled to a PCB, to form a package system. The package structure includes a package base layer, a chip, a package body, and a connecting assembly. The package base layer provides support for the entire structure, and has a first surface and a second surface that are opposite to each other. The chip is coupled to the first surface, and there is a chip pad on a surface that is of the chip and that is away from the package base layer. The package body covers the package base layer and the chip to protect the structure. To lead out a signal of the chip, the chip pad is wired to a surface of the package body through the connecting assembly.

In the foregoing package structure, the chip is coupled to the package base layer in a mounting manner, and the signal of the chip may be led out to the surface of the package body through the connecting assembly. This is equivalent to that the signal may be directly led out to a surface of the entire package structure without using pins. The connecting assembly may be disposed based on a specific structure. A separate structure of the connecting assembly facilitates reduction of a size of the package structure and facilitates implementation of a small size of the package structure. In addition, the structure of the connecting assembly facilitates shortening of a wiring path of a wire bond, so that a possible parasitic effect of the wire bond can be reduced.

The connecting assembly may include a line layer. To lead out the signal of the chip to the surface of the structure, the line layer is exposed from the surface of the package body, and is connected to the chip pad through a metal via. The line layer may have a single-layer structure or a multi-layer structure. When the line layer has a multi-layer structure, more functions can be implemented according to a need.

In one embodiment, to wire the connecting assembly to the surface of the package body, an opening for exposing the connecting assembly may be formed on the surface of the package body. Such a structure does not increase the size of the entire structure.

A plurality of chips may be set based on function implementation. When there are a plurality of chips, signal interconnection may also be implemented between the plurality of chips through interconnection of the foregoing connecting assembly. It is set herein that surfaces that are of chip pads on the plurality of chips and that are away from the package base layer are coplanar, so as to help maintain a size of the connecting assembly in a thickness direction of the package structure, to help reduce the size of the entire structure in the direction.

In one embodiment there may be two chips having different thicknesses, and the two chips are set to a first subchip and a second subchip. A thickness of the first subchip is less than a thickness of the second subchip. To make surfaces of chip pads on the two chips coplanar, an accommodating groove may be disposed on the first surface of the package base layer. A depth of the accommodating groove is equivalent to a height difference between the first subchip and the second subchip. The second subchip is embedded into the accommodating groove, so as to achieve an effect that the surfaces of the chip pads on the two chips are coplanar.

In some application scenarios, the package base layer needs to be wired to the surface of the package body. To maintain a thickness of the connecting assembly, a metal block may be formed on the first surface of the package base layer through soldering or electroplating. A surface that is of the metal block and that is away from the package base layer is coplanar with a surface that is of the chip pad and that is away from the package base layer. The metal block is also connected to the connecting assembly.

To improve a heat dissipation effect of the package structure, the package base layer herein may include a thermally conductive substrate and a first heat dissipation layer and a second heat dissipation layer that are disposed on two sides of the thermally conductive substrate. The first heat dissipation layer and the second heat dissipation layer may be made of materials such as copper, aluminum, and nickel that have good thermal conductivity. The second heat dissipation layer is disposed in a form of exposing from the package body, so that a better heat dissipation effect can be achieved.

In addition, a heat sink may be further disposed on a side that is of the second heat dissipation layer and that is away from the thermally conductive substrate. The heat sink has a plurality of heat dissipation fins, so that a heat dissipation area can be increased. In this way, heat dissipation efficiency can be improved.

According to a second aspect, based on the foregoing package structure, this application further provides a package system. The package system includes a circuit board and any one of the foregoing package structures. The circuit board is connected to the connecting assembly, to implement coupling to the package structure. This can help the system implement a function.

DESCRIPTION OF EMBODIMENTS

Figure 1A:
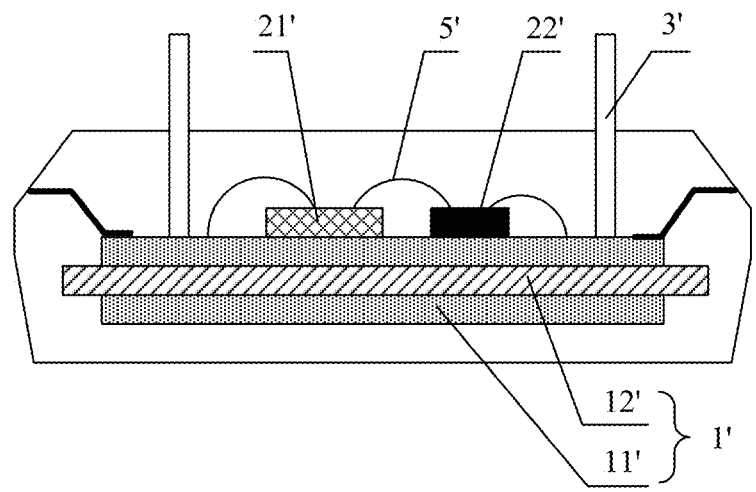
FIG. 1a is a schematic diagram of a structure of a cross section of housing package according to a conventional technology.
Figure 1B:
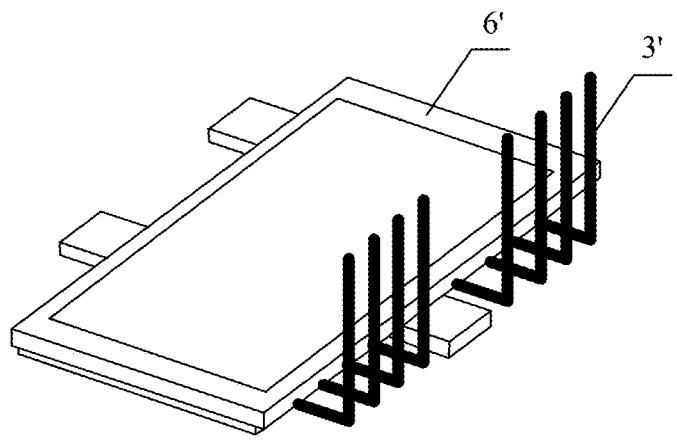
FIG. 1b and FIG. 1c are schematic diagrams of a structure of molding package according to a conventional technology.
Figure 1C:
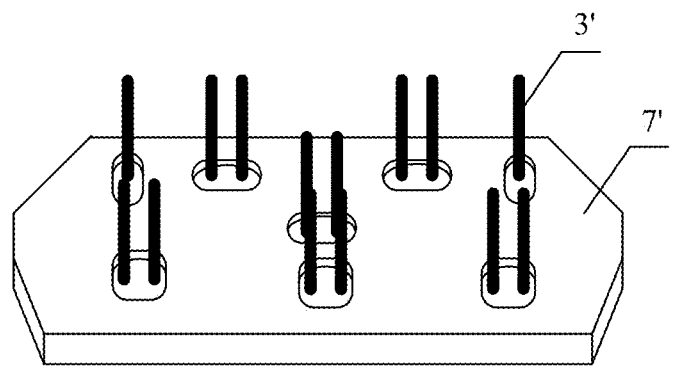

Development of electronic products tends to be miniaturized, and a package structure of a chip of the electronic product also needs to be improved accordingly. Housing package and molding package are two commonly used packaging forms at present. For a structure of the housing package, refer to FIG. 1a. During manufacturing, a chip 21' and another component 22' are surface-mounted on a substrate (a ceramic board 12' covered with copper 11') I'. Pins 3' are welded on the substrate 1' or inserted into a housing thermoplastic plastic component 4'. The chip 21' and the another component 22' are interconnected through a wire bond 5', assembled with a ceramic housing, and then molded to complete chip protection and insulation. The pin 3' extends from a middle position of the structure. For a structure of the molding package, refer to FIG. 1b and FIG. 1c. During manufacturing, a chip 21' and another component 22' are also surface-mounted on a substrate 1', interconnected through a wire bond 5', and then integrally welded to a wire-bond frame 6' for plastic packaging. A pin 3' is formed by punching and bending a pin from a wire-bond frame on a side of the structure of the molding package (as shown in FIG. 1b), or is inserted into a groove in a middle position of a molding body 7' (as shown in FIG. 1c). Related structures of the substrate 1', the chip 21', the another component 22', and the wire bond 5' in the molding package shown in FIG. 1b and FIG. 1c are similar to structures shown in FIG. 1a, and therefore are not shown in the figures. Pins are used in both the foregoing two package structures. As a result, a size of the entire package structure is relatively large. This cannot meet a requirement of existing electronic products for product miniaturization and is not conducive to implementation of high integration. In addition, a relatively long wire bond may cause a risk of a parasitic effect.

To resolve the foregoing problem, this application provides a package structure, so as to reduce a size of the structure on the basis of implementing a function, and simplify a preparation process. To make the objectives, technical solutions, and advantages of this application clearer, the following further describes this application in detail with reference to the accompanying drawings.

Terms used in the following embodiments are merely for the purpose of describing specific embodiments, but are not intended to limit this application. As used in the specification and appended claims of the application, singular expressions "one", "a", "the", "the foregoing", "this", and "the one" are also intended to include expressions such as "one or more", unless the contrary is clearly indicated in its context.

Reference to "one embodiment" or "some embodiments" described in this specification or the like means that one or more embodiments of this application include a particular feature, structure, or characteristic described in combination with the embodiment. Therefore, phrases "in one embodiment", "in some embodiments", "in some other embodiments", "in some additional embodiments", and the like that appear in different parts in this specification do not necessarily mean referring to a same embodiment, but mean "one or more embodiments, but not all embodiments", unless otherwise specifically emphasized in other ways. Terms "include", "comprise", "have", and their variants all mean "include but are not limited to", unless otherwise specifically emphasized in other ways.

Figure 2:
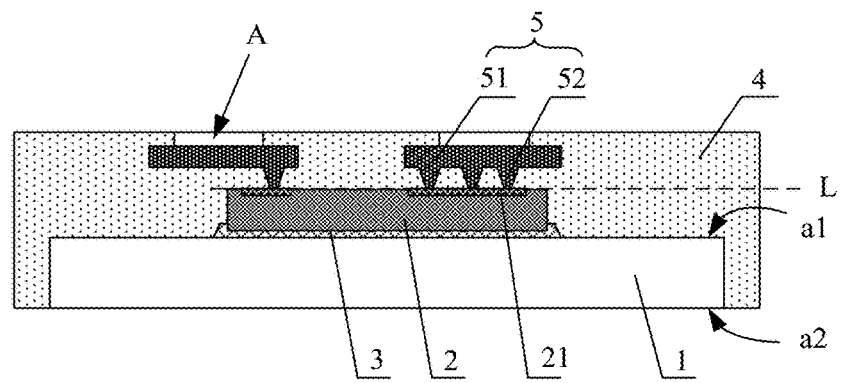
FIG. 2 to FIG. 7b are schematic diagrams of a structure of a cross section of a package structure according to an embodiment of this application.

For a package structure provided in an embodiment of this application, refer to a schematic diagram of a structure of a cross section shown in FIG. 2. The package structure includes a package base layer 1. The package base layer 1 has a first surface a1 and a second surface a2 that are opposite to each other. A chip 2 is coupled to the first surface a1. The chip 2 may be specifically a power supply chip. The chip 2 is welded on the first surface a1 of the package base layer 1 through solder 3. On a surface that is of the chip 2 and that is away from the package base layer 1, there is a chip pad 21 that does not extend from the surface of the chip 2. The chip pad 21 herein is flush with the surface of the chip 2. One chip 2 may have a plurality of chip pads 21. A package body 4 covers the package base layer 1 and the chip 2. The chip pad 21 is wired to a surface of the package body 4 through a connecting assembly 5. Herein, to enable the connecting assembly 5 to be exposed from the surface of the package body 4, an opening A is disposed on the package body 4. A position of the opening A corresponds to a position of the connecting assembly 5. During specific implementation, adjustment may be made according to a need. Details are not described herein.

In the package structure, the chip pad 21 is led out to the surface of the package body 4 through the connecting assembly 5. In comparison with the conventional technology shown in FIG. 1a to FIG. 1c, a structure of a pin is omitted, a wiring path is shortened, and a size of the entire structure can be effectively reduced. In addition, parasitic resistance and parasitic inductance are further reduced. For a preparation process of the entire package structure, a dedicated preparation process for the pin is not required, and assembly costs can be further reduced. The package structure makes it more convenient to implement a connection to a circuit board by using a surface mounting technology.

Still refer to FIG. 2. The connecting assembly 5 may specifically include a line layer 51. The line layer 51 is specifically connected to the chip pad 21 through a metal via 52. The line layer 51 is plate-shaped relative to the package base layer 1 and is parallel to the package base layer 1. The line layer 51 implements electrical signal connection to the chip pad 21 by puncturing the chip 2 and filling metal to obtain the metal via 52. Such a structure can effectively reduce a size in a direction perpendicular to the package base layer 1. In addition, such a structure form can shorten a wiring path in a direction parallel to the package base layer 1, is conducive to miniaturization of a size of the entire structure, and may further reduce parasitic resistance and parasitic inductance. Specifically, the line layer 51 may be a single-layer line or a multi-layer line. A setting manner of the line layer 51 is relatively flexible on the basis of ensuring the foregoing entire structure, and a more complex function can be implemented.

In the package structure shown in FIG. 2, the chip 2 has two chip pads 21 (certainly, there may alternatively be three, four, or more chip pads 21). Surfaces that are of the two chip pads 21 and that are away from the chip 2 are kept flush with the surface of the chip 2. To keep sizes of metal vias 52 (which are equivalent to depths of the metal vias 52) consistent in the direction perpendicular to the package base layer 1, surfaces that are of the chip 2 and that are away from the package base layer 1 need to keep consistent (as shown by a contour line L in FIG. 2). In this case, surfaces that are of the plurality of chip pads 21 and that are away from the chip 2 are in a same plane. The metal via 52 with a same depth may determine the size of the metal via 52 in the direction perpendicular to the package base layer 1. Determining the size is conducive to reduction of the size in the direction perpendicular to the package base layer 1. In addition, the metal via 52 with the same depth may be formed at one time during manufacturing. This is conducive to simplification of the process.

Figure 3:
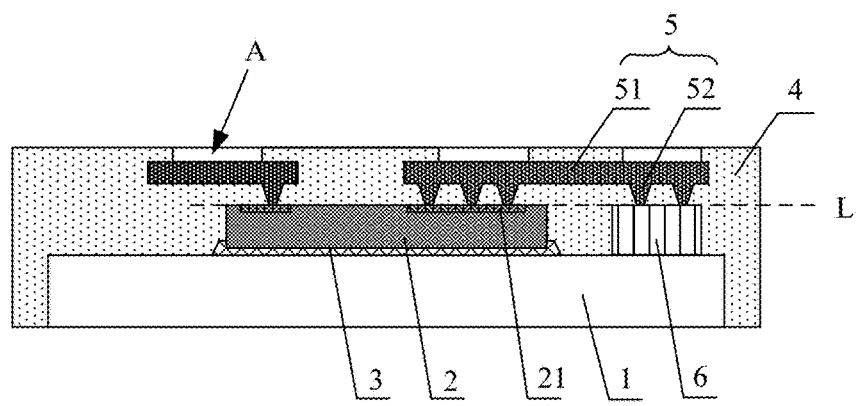

In some embodiments, the metal via 52 needs to be connected to the package base layer 1. However, it is clear that the first surface a1 of the package base layer 1 and the surface that is of the chip 2 and that is away from the package base layer 1 are not in a same plane. To ensure that the depths of the metal vias 52 are consistent, as shown in FIG. 3, a metal block 6 (as shown by a contour line L in FIG. 3) with a height equal to or close to that of the chip 2 may be disposed, in a welding or electroplating manner, on a side that is of the package base layer 1 and that faces the chip pad 21. A part of the metal vias 52 are connected to the metal block 6. The metal block 6 may be connected to the chip 2 through the metal via 52 and the line layer 51. Because a surface that is of the chip pad 21 and that is away from the chip 2 is flush with the surface that is of the chip 2 and that is away from the package base layer 1, a surface that is of the metal block 6 and that is away from the package base layer is coplanar with a surface that is of the chip pad 21 and that is away from the package base layer 1. Existence of the metal block 6 can keep depths of all metal vias 52 basically consistent. Herein, a material of the metal block 6 may be copper, aluminum, nickel, gold, or an alloy thereof.

Figure 4:
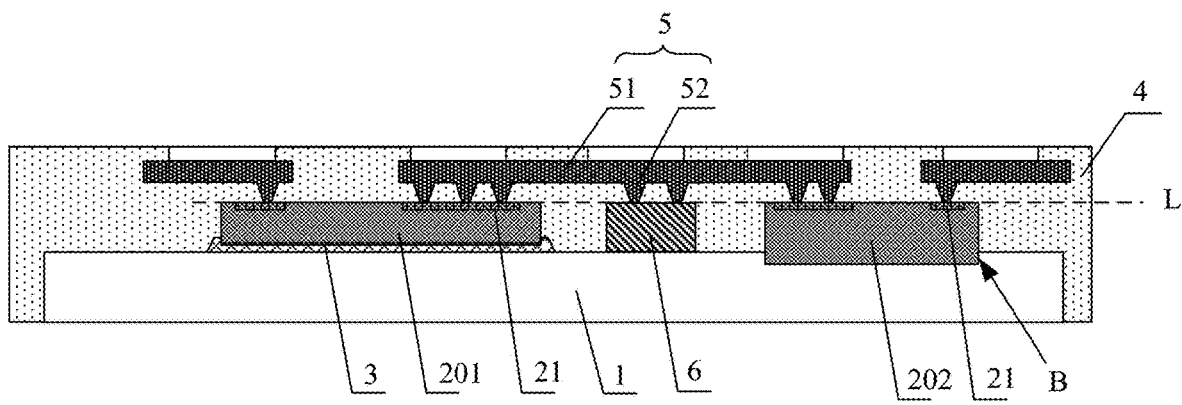

In the package structures shown in FIG. 2 and FIG. 3, one chip 2 is disposed. In some embodiments, a plurality of chips 2 may be specifically disposed. Under an ideal condition, all chips 2 have a same thickness (that is, a size in the direction perpendicular to the package base layer 1), so that surfaces that are of all the chips 2 and that are away from the package base layer 1 are located in a same plane. However, different chips 2 may have different heights. FIG. 4 shows a possible package structure. An example in which there are two chips 2 is used. Specifically, a first subchip 201 and a second subchip 202 may be set (certainly, there may be another subchip, and only two are used as an example herein). The first subchip 201 and the second subchip 202 have different thicknesses. When a thickness of the first subchip 201 is less than a thickness of the second subchip 202, to enable a surface that is of a chip pad 21 on the first subchip 201 and that is away from the first subchip 201 to be on a same surface with a surface that is of a chip pad 21 on the second subchip 202 and that is away from the second subchip 202, an accommodating groove B may be formed on a first surface a1 of a package base layer 1. A depth of the accommodating groove B is equivalent to a height difference between the first subchip 201 and the second subchip 202. The second subchip 202 is disposed in the accommodating groove B, so that a surface that is of the first subchip 201 and that is away from the package base layer 1 is kept flush with a surface that is of the second subchip 202 and that is away from the package base layer 1. In this way, the surface that is of the chip pad 21 on the first subchip 201 and that is away from the first subchip 201 is flush, that is, coplanar with the surface that is of the chip pad 21 on the second subchip 202 and that is away from the second subchip 202. It should be understood that, when there are two or more chips 2, compatibility can be better implemented. This gives a higher degree of freedom to design a package product.

It should be understood that a manner of forming the accommodating groove B in FIG. 4 may be one or a combination of processes such as etching, digging, and embossing. Details are not described herein. The second subchip 202 may be directly disposed in the accommodating groove B, or may be welded into the accommodating groove B through solder 3 like the first subchip 201.

In the package structure shown in FIG. 4, a second surface a2 of the package base layer 1 is exposed from a package body 4, and heat of the chip 2 may be transferred to the package base layer 1 and dissipated from a position at which the package base layer 1 is exposed from the package body 4. To improve a heat dissipation capability of a package structure, based on the package structure shown in FIG. 2, an embodiment of this application further provides a package structure shown in FIG. 5a or FIG. 5b. A package base layer 1 in the package structure may include a thermally conductive substrate 11 and a first heat dissipation layer 12 and a second heat dissipation layer 13 that are disposed on two sides of the thermally conductive substrate 11. A surface that is of the first heat dissipation layer 12 and that is away from the thermally conductive substrate 11 is equivalent to a first surface a1. A surface that is of the second heat dissipation layer 13 and that is away from the thermally conductive substrate 11 is equivalent to a second surface a2. The foregoing chip 2 is disposed on the surface that is of the first heat dissipation layer 12 and that is away from the thermally conductive substrate 11. The second heat dissipation layer 13 is exposed from a package body 4.

Figure 5A:
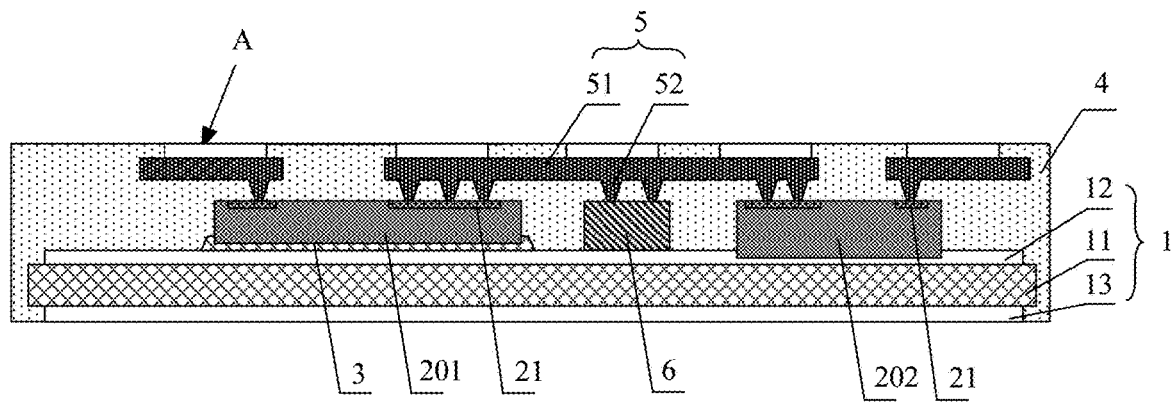
Figure 5B:
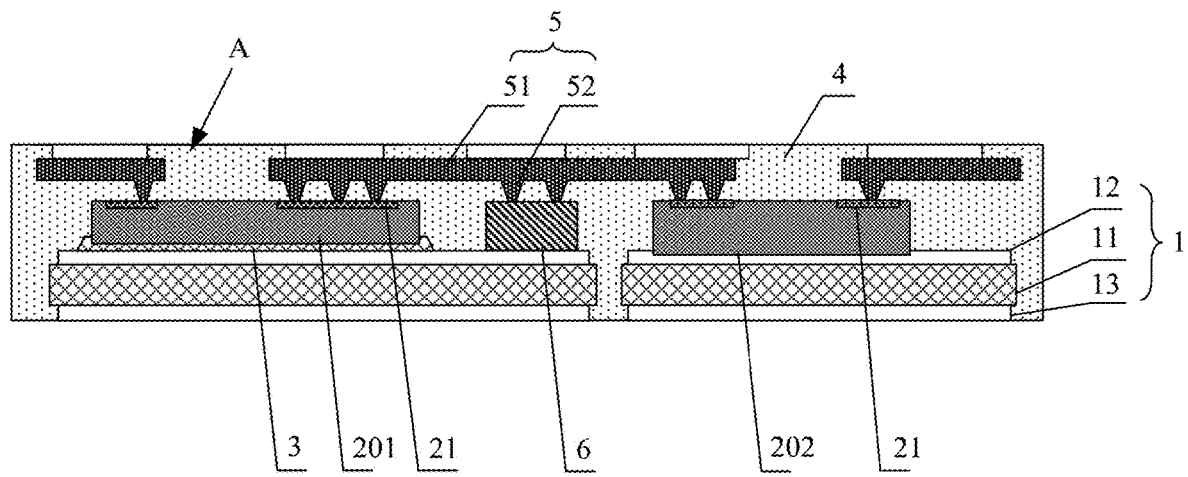

It should be noted that, in FIG. 5a, there is one package base layer 1. Two chips 2 and a metal block 6 are both disposed on a first heat dissipation layer 12 of the package base layer 1. However, in FIG. 5b, there are two package base layers 1. Structures of the two package base layers are similar, and both have a thermally conductive substrate 11 and a first heat dissipation layer 12 and a second heat dissipation layer 13 that are disposed on two sides of the thermally conductive substrate 11. Thicknesses of the two package base layers 1 may be the same, or may be different. When the thicknesses of the two package base layers 1 are different, the chip 2 may alternatively be adjusted in a manner shown in FIG. 5a or FIG. 5b through an accommodating groove B and the metal block 6, so that depths of metal vias 52 are consistent.

Figure 6:
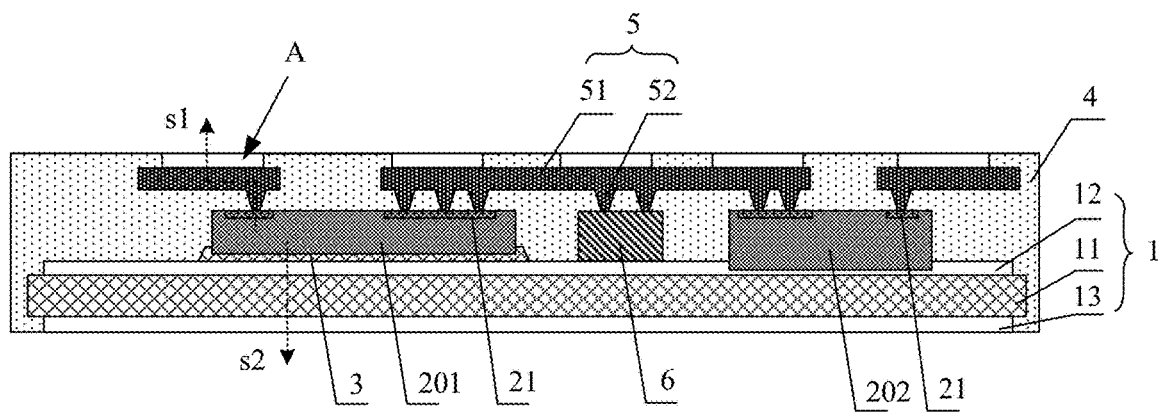

The thermally conductive substrate 11 is made of an insulating material with good thermal conductivity, for example, ceramic or metal with high thermal conductivity. The first heat dissipation layer 12 and the second heat dissipation layer 13 are respectively formed on two opposite sides of the thermally conductive substrate 11, so that heat of the chip 2 can be dissipated from one side of the thermally conductive substrate 11. The package structure shown in FIG. 5a is used as an example. FIG. 6 schematically shows a heat dissipation mode of the chip 2. In this structure, the chip 2 is surface-mounted on a side of the first surface a1 of the package base layer 1. On one hand, as shown by a path s1, heat generated by the chip 2 during working may be dissipated through the chip pad 21, the metal via 52, and the line layer 51 from the opening A of the package body 4. On the other hand, as shown by a path s2, the heat generated by the chip 2 during working may be dissipated through the solder 3, the first heat dissipation layer 12, the thermally conductive substrate 11, and the second heat dissipation layer 13, to implement heat dissipation on both sides of the chip 2. In this way, the chip 2 has a better heat dissipation capability, and a heat dissipation effect of the package structure can be effectively improved.

Figure 7A:
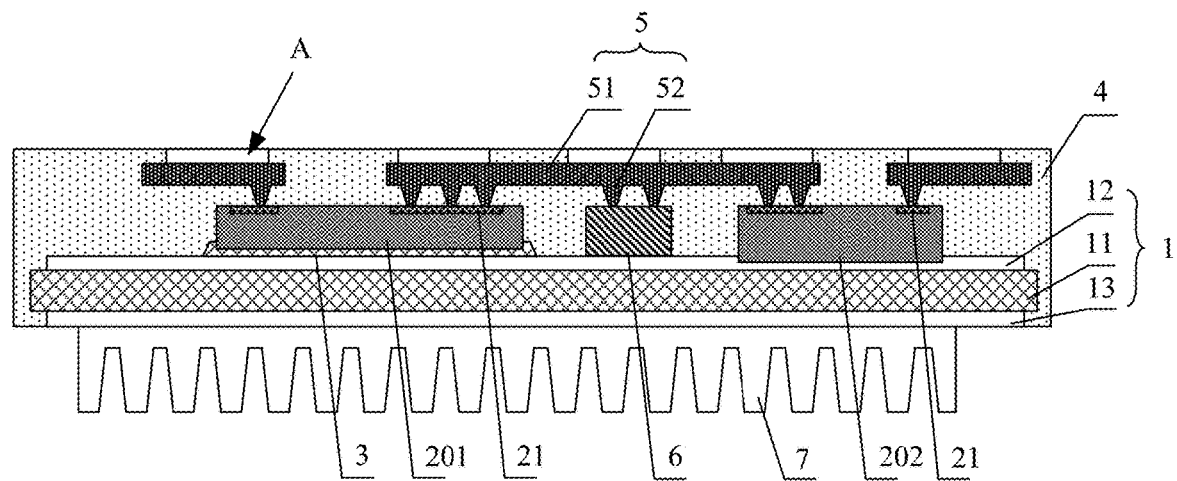

In addition, based on the package structure shown in FIG. 5a, as shown in FIG. 7a, a heat sink 7 may be further added on a surface of the second heat dissipation layer 13. The heat sink 7 has a plurality of vertical fins, so that the heat sink 7 has a larger surface area. This is equivalent to increasing a heat dissipation area of the second heat dissipation layer 13, so as to enhance a heat dissipation effect.

Figure 7B:
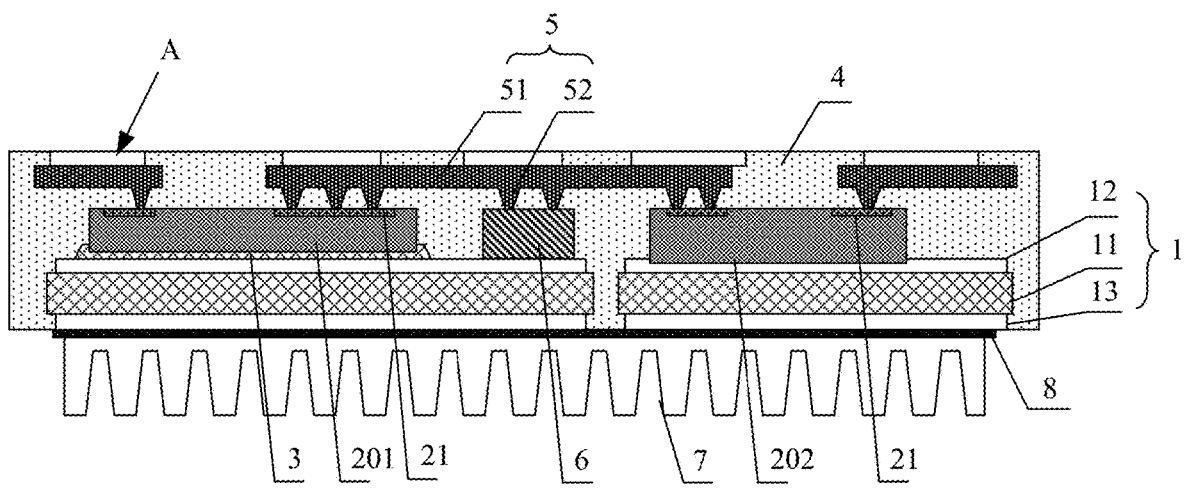

As shown in FIG. 7b, when there are a plurality of package base layers 1, second heat dissipation layers 13 on all package base layers 1 are not connected. To weld a heat sink 7, a copper connection layer 8 may be disposed on surfaces of the second heat dissipation layers 13 to connect the plurality of second heat dissipation layers 13 as a whole. Certainly, the connection layer 8 may alternatively be made of another material with good thermal conductivity, such as aluminum or nickel. A shape of the connection layer 8 is not limited. Different planar shapes may be designed according to a need, so as to adapt to a welding requirement of the heat sink 7.

It should be understood that, although the chip 2 in the foregoing embodiment is a power supply chip, a design concept of the package structure provided in embodiments of this application is also applicable to another type of chip 2, for example, a radio frequency chip, a power amplifier chip, an artificial intelligence, artificial intelligence (AI) chip, a central processing unit (CPU) chip, or a graphics processing unit (GPU) chip. These chips have a high heat dissipation requirement in common. Therefore, the package structure provided in embodiments of this application can meet the heat dissipation requirement of the chips.

Figure 8:
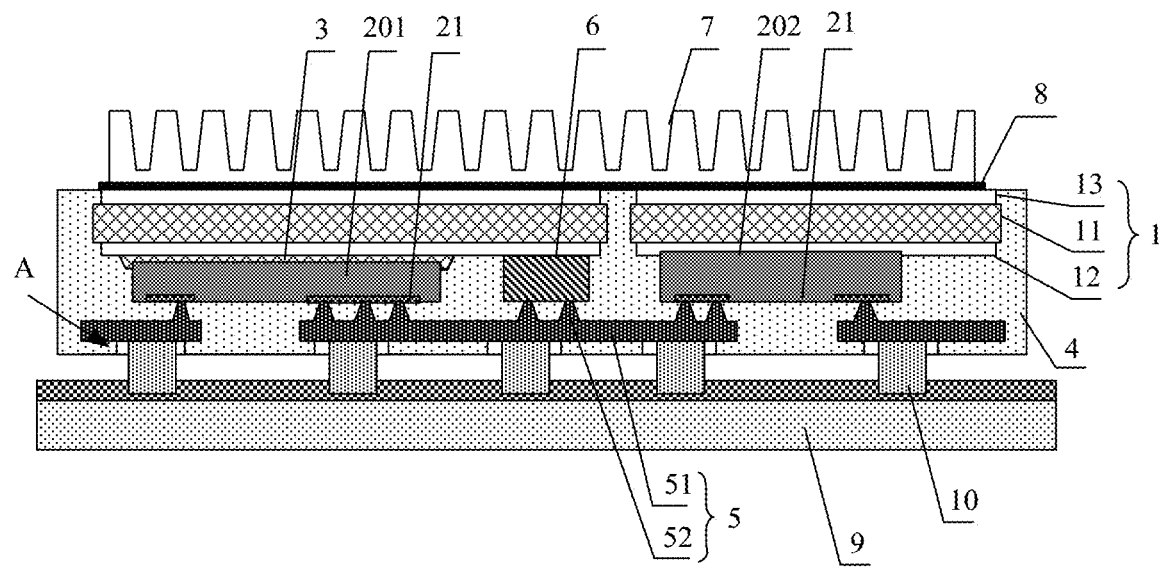
FIG. 8 is a schematic diagram of a structure of a cross section of a package system according to an embodiment of this application.

Based on the foregoing package structure, this application further provides a package system. As shown in FIG. 8, the package system includes a circuit board 9 and the package structure in any one of the foregoing embodiments (the package structure shown in FIG. 7a is used as an example herein). In a preparation process, a line layer 51 exposed from an opening A of the package structure is welded to the circuit board 9 through a welding joint 10, to implement electrical connection, so as to help the system implement a function. The circuit board 9 may be specifically a printed circuit board, a flexible circuit board, or another circuit board. The welding joint 10 may be solder such as solder paste. Details are not described herein.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A package structure, comprising:
    a package base layer having a first surface and a second surface that are opposite to each other;
    one or more chips coupled to the first surface and one or more chip pads omitting using a pin, each chip of the one or more chips including a chip pad of the one or more chip pads on a surface of the chip away from the package base layer, wherein two chips of the one or more chips comprises a first subchip and a second subchip, wherein a thickness of the first subchip is less than a thickness of the second subchip, wherein the first surface of the package base layer has an accommodating groove for embedding only the second subchip, wherein the first subchip is on the first surface of the package base layer, wherein the second subchip is directly disposed in the accommodating groove, and wherein a surface that is of the first subchip and that is away from the package base layer is kept flush with a surface that is of the second subchip and that is away from the package base layer;
    a connecting assembly including one or more metal vias;
    a metal block disposed on the first surface connecting to at least one of the one or more metal vias, wherein a surface of the metal block away from the package base layer is coplanar with a surface of the chip pad away from the package base layer, such that the one or more metal vias have a consistent depth; and
    a package body covering the package base layer and the one or more chips, wherein the one or more chip pads are wired to a surface of the package body through the connecting assembly.

2. The package structure according to claim 1, wherein the connecting assembly comprises a line layer partially exposed from the surface of the package body, and wherein the line layer is connected to the one or more chip pads through the one or more metal vias.

3. The package structure according to claim 2, wherein the line layer is a multi-layer structure.

4. The package structure according to claim 1, wherein an opening for exposing the connecting assembly is formed on the surface of the package body.

5. The package structure according to claim 1, wherein the connecting assembly comprises a line layer partially exposed from the surface of the package body, and wherein the line layer is connected to the one or more chip pads through one or more metal vias, and wherein an opening for exposing the connecting assembly is formed on the surface of the package body.

6. The package structure according to claim 1, wherein the connecting assembly comprises a line layer partially exposed from the surface of the package body, and wherein the line layer is connected to the one or more chip pads through one or more metal vias, wherein the line layer is a multi-layer structure, and wherein an opening for exposing the connecting assembly is formed on the surface of the package body.

7. The package structure according to claim 1, the one or more chips are connected to the connecting assembly, and surfaces of the one or more chip pads on the one or more chips away from the package base layer are coplanar.

8. The package structure according to claim 1, wherein the connecting assembly comprises a line layer partially exposed from the surface of the package body, and wherein the line layer is connected to the one or more chip pads through one or more metal vias, wherein the one or more chips are connected to the connecting assembly, and wherein surfaces that are of chip pads on the one or more chips and that are away from the package base layer are coplanar.

9. The package structure according to claim 1, wherein the connecting assembly comprises a line layer partially exposed from the surface of the package body, and wherein the line layer is connected to the one or more chip pads through one or more metal vias, wherein the line layer is a multi-layer structure wherein the one or more chips are connected to the connecting assembly, and wherein surfaces of the one or more chip pads on the one or more of chips away from the package base layer are coplanar.

10. The package structure according to claim 1, wherein the connecting assembly comprises a line layer partially exposed from the surface of the package body, wherein the line layer is connected to the one or more chip pads through one or more metal vias, wherein the line layer is a multi-layer structure, wherein an opening for exposing the connecting assembly is formed on the surface of the package body, wherein the one or more chips are connected to the connecting assembly, and wherein surfaces of the one or more chip pads on the one or more chips away from the package base layer are coplanar.

11. The package structure according to claim 1, wherein the metal block is connected to the connecting assembly and has a height equal to a height of the first subchip.

12. The package structure according to claim 1, wherein the package base layer comprises a thermally conductive substrate, a first heat dissipation layer and a second heat dissipation layer that are disposed on two sides of the thermally conductive substrate, wherein the one or more chips are disposed on the first heat dissipation layer, and wherein the second heat dissipation layer is exposed from the package body.

13. The package structure according to claim 12, further comprising a heat sink disposed on a side of the second heat dissipation layer away from the thermally conductive substrate.

14. A package system, comprising:
a circuit board; and
a package structure comprising:
  a package base layer having a first surface and a second surface that are opposite to each other;
  one or more chips coupled to the first surface and one or more chip pads omitting using a pin, each chip pad of the one or more chip pads on a surface of a chip of the one or more chips away from the package base layer, wherein two chips of the one or more chips comprises a first subchip and a second subchip, wherein a thickness of the first subchip is less than a thickness of the second subchip, wherein the first surface of the package base layer has an accommodating groove for embedding only the second subchip, wherein the first subchip is on the first surface of the package base layer, and wherein the second subchip is directly disposed in the accommodating groove, and wherein a surface that is of the first subchip and that is away from the package base layer is kept flush with a surface that is of the second subchip and that is away from the package base layer;
  a connecting assembly including one or more metal vias;
  a metal block disposed on the first surface connecting to at least one of the one or more metal vias, wherein a surface of the metal block away from the package base layer is coplanar with a surface of the chip pad away from the package base layer, such that the one or more metal vias have a consistent depth; and
  a package body covering the package base layer and the one or more chips,
  wherein the one or more chip pads are wired to a surface of the package body through the connecting assembly; and
wherein the circuit board is welded to the connecting assembly.

15. The package structure according to claim 14, wherein the connecting assembly comprises a line layer partially exposed from the surface of the package body; and
wherein the line layer is connected to the one or more chip pads through one or more metal vias.

16. The package structure according to claim 15, wherein the line layer is a multi-layer structure.

17. The package structure according to claim 14, wherein an opening for exposing the connecting assembly is formed on the surface of the package body.

18. The package structure according to claim 14, wherein the one or more chips are connected to the connecting assembly, and wherein surfaces of the one or more chip pads on the one or more chips away from the package base layer are coplanar.

* * * * *